(12) United States Patent
Niwa et al.

(10) Patent No.: US 8,581,763 B2
(45) Date of Patent: Nov. 12, 2013

(54) DELTA-SIGMA MODULATOR AND SIGNAL PROCESSING SYSTEM

(75) Inventors: Atsumi Niwa, Kanagawa (JP); Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 55 days.

(21) Appl. No.: 13/338,714

(22) Filed: Dec. 28, 2011

(65) Prior Publication Data
US 2012/0194365 A1 Aug. 2, 2012

(30) Foreign Application Priority Data
Jan. 31, 2011 (JP) ................................. 2011-017648

(51) Int. Cl.
*H03M 3/00* (2006.01)
(52) U.S. Cl.
USPC .......................................... 341/143; 341/155
(58) Field of Classification Search
USPC .......................................... 341/144, 155, 143
See application file for complete search history.

(56) References Cited

U.S. PATENT DOCUMENTS

| | | | |
|---|---|---|---|
| 7,242,336 B1 | 7/2007 | Jensen | |
| 7,423,567 B2 * | 9/2008 | Melanson | 341/143 |
| 7,576,670 B2 | 8/2009 | Clara et al. | |
| 8,279,099 B2 * | 10/2012 | Zare-Hoseini | 341/143 |
| 2010/0066577 A1 | 3/2010 | Huang | |
| 2011/0254718 A1 * | 10/2011 | Matsukawa et al. | 341/143 |
| 2012/0075133 A1 * | 3/2012 | Guinea Trigo et al. | 341/143 |

FOREIGN PATENT DOCUMENTS

WO    WO-2006/024317 A1    3/2006

OTHER PUBLICATIONS

Extended European Search Report issued May 31, 2012 for corresponding European Application No. 12 15 1715.
Matsukawa et al. "A Fifth-Order Continuous-Time Delta-Sigma Modulator with Single-Opamp Resonator" IEEE, vol. 45, No. 4, Apr. 4, 2010, pp. 697-706, XP002675771.
Di Giandomenico A. et al., "A 15 MHZ Bandwidth Sigma-Delta ABC with 11 Bits of Resolution in 0.13μm CMOS" European Solid-State Circuit, 2003, ESSCIRC '03, Conference on Sep. 16-18, 2003, Piscataway, NJ USA, IEEE Dec. 16, 2003, pp. 233-236. XP010677452.
W. Yang, et al., "A 100mW 10MHz-BW CT ΔΣ Modulator with 87dB DR and 91dBc IMD," 2008 ISSCC, Session 27, pp. 498-499, 631.

* cited by examiner

*Primary Examiner* — Peguy Jean Pierre
(74) *Attorney, Agent, or Firm* — Sony Corporation

(57) ABSTRACT

A ΔΣ modulator includes: a plurality of integrators cascaded to an input of an analog signal; a quantizer for quantizing an output signal of the integrator at a last stage and outputting a resultant digital signal; a DA converter for feedback for converting the digital signal obtained by the quantizer into an analog signal and supplying the analog signal to an input side of at least the integrator at a first stage; and an adder, arranged at an input stage side of the integrator at the last stage, for adding an output of the integrator at a preceding stage of the integrator at the last stage to at least one path signal supplied from at least another path via a first resistor having at least a first coefficient. The integrator at the last stage includes an operational amplifier, an integration capacitor, and a second resistor having a second coefficient.

14 Claims, 10 Drawing Sheets

DELTA-SIGMA MODULATOR AND SIGNAL PROCESSING SYSTEM

BACKGROUND

The present disclosure relates to a continuous-time system delta-sigma (ΔΣ) modulator and a signal processing system which are applied to audio equipment and medical instruments in addition to receivers in wireless communication.

Referring to FIG. 1A and FIG. 1B, there are shown conceptual diagrams illustrating general continuous-time system quadrature lowpass type ΔΣ modulators. FIG. 1A shows a feedback-type ΔΣ modulator and FIG. 1B shows a feedforward-type ΔΣ modulator.

A ΔΣ modulator 1A shown in FIG. 1A is made up of integrators INT1, INT2, INT3, and INT4, a quantizer Quan, adders ADD1, ADD2, ADD3, and ADD4, and digital-to-analog (DA) converts DAC1, DAC2, DAC3, and DAC4.

A ΔΣ modulator 1B shown in FIG. 1B is made up of integrators INT1, INT2, INT3, and INT4, a quantizer Quan, adders ADD1 and ADD2, and a DA converter DAC1.

In FIGS. 1A and 1B, u is representative of an analog input signal and v is representative of a digital output signal. $a_1$, $a_2$ and $a_3$ are each representative of a feedback gain or a gain in feedforward path. Q is representative of an effective gain of the quantizer. The gain of the DA converts DAC4 and DAC1 that give feedback to the integrator INT4 is 1.

A noise transmission function (NTF) to digital output signal v of quantization noise generated in the quantizer Quan is expressed by equation (1) below in both FIG. 1A and FIG. 1B, indicating a frequency characteristic of highpass type.

$$NTF = \frac{s^4}{s^4 + a_1 Q s^3 + a_2 Q s^2 + a_3 Q s + Q} \quad (1)$$

To be more specific, a quantization noise generated in the quantizer by a feedback effect in the ΔΣ modulator is noise-shaped to be shifted to high-frequency area, thereby providing a high S/N ratio within a signal band.

Referring to FIG. 2, there is shown a circuit diagram illustrating an exemplary configuration of an integrator providing an element block of the ΔΣ modulator.

Referring to FIG. 3, there is shown a circuit diagram illustrating an exemplary configuration of an adder providing an element block of the ΔΣ modulator.

The integrator INT shown in FIG. 2 has an OTA (Operational Transconductance Amplifier) 1, a resistor element R, and a capacitor C.

The adder ADD shown in FIG. 3 has an OTA2, and a resistor elements R1 and R2.

A transfer characteristic between input and output of the integrator INT is expressed as equation (2) below by use of a resistor (R) and a capacitor (C).

$$T(s) = \frac{v_{out}}{v_{in}} = \frac{1}{sCR} \quad (2)$$

Likewise, a transfer characteristic between input and output of the adder ADD is expressed as equation (3) below by use of two resistors R1 and R2.

$$T(s) = \frac{v_{out}}{v_{in}} = \frac{R_2}{R_1} \quad (3)$$

As shown in FIG. 2 and FIG. 3, the integrator INT and the adder ADD can each be configured by use of one amplifier OTA.

Only if the adder ADD is arranged immediately before the integrator INT, one amplifier can realize both an integrator and an adder.

Referring to FIG. 4, there is shown a circuit diagram illustrating a circuit realized by an adder and an integrator having two inputs and one output.

Output voltage vout of this circuit can be expressed as equation (4) below, providing an operation realized by an adder and an integrator combined.

$$V_{out} = \frac{1}{sCR_1} V_{in1} + \frac{1}{sCR_2} V_{in2} \quad (4)$$

Now, paying attention to the ΔΣ modulator shown in FIG. 1, it is seen that the modulator can be configured by four amplifiers because all adders are arranged immediately before the integrator in the case of feedback type shown in FIG. 1A.

On the other hand, in the case of the feedforward type shown in FIG. 1B, the adder arranged immediately before the quantizer Quan cannot form a circuit with the integrator, so that five amplifiers are required, thereby leading to increased power and increased circuit scale.

In order to avoid a situation where one more amplified is required, a ΔΣ modulator of feedforward type that does not use the adder arranged immediately before the quantizer may be considered.

Referring to FIG. 5, there is shown a configuration of a ΔΣ modulator that does not use any adder immediately before a quantizer as a variation to the configuration shown in FIG. 1B.

In a ΔΣ modulator 1C shown in FIG. 5, every add operation is executed in front of an integrator INT1 of the last stage, so that every feedback signal passes two integrators.

Passing two integrators raises the degree by two degrees, so that the feedforward path including $a_1$ is set to $sa_1$ rather than a constant, thereby realizing first-degree coefficient by providing a differential characteristic.

Referring to FIG. 6, there is shown a circuit for realizing a portion enclosed by dotted lines shown in FIG. 5.

A feedforward path from the output of the integrator INT4 to the input of the integrator INT1 can be realized by coupling, by use of a capacitor, the input and the output of an amplifier OTA configuring a corresponding integrator.

SUMMARY

In the above-mentioned circuit 2, however, a feedforward capacitance $C_{ff}$ is added, so that a capacitive load occurs in the integrator INT1, thereby causing an increased power dissipation for limiting the band.

In addition, for the integrator INT4, a current of a high frequency obtained by converting an output voltage of the integrator INT1 by an admittance called $C_{ff}$ must be entered, a power dissipation will be increased.

In order to circumvent the above-mentioned problems, a technology for using both feedforward and feedback is proposed (refer to "A 100 mW 10 MHz-BW CT ΔΣ Modulator with 87 dB DR and 91 dBc IMD," ISSCC Dig. Tech. Papers, pp. 498-499, February 2008.).

Referring to FIG. 7, there is shown a ΔΣ modulator that uses both feedback and feedforward.

In the ΔΣ modulator 1D shown in FIG. 7, the adder arranged immediately before the quantizer that is required in the case of feedforward type is removed but two DA converters are required, thereby increasing power dissipation and circuit scale.

Therefore, it is desirable to provide a ΔΣ modulator and a signal processing system which are configured not to involve an increased power dissipation and an increased circuit scale.

In carrying out the present disclosure and according to a first form thereof, there is provided a ΔΣ modulator. This ΔΣ modulator has a plurality of integrators cascaded to an input of an analog signal; a quantizer configured to quantize an output signal of the integrator at a last stage and output a resultant digital signal; a DA converter for feedback configured to convert the digital signal obtained by the quantizer into an analog signal and supply the analog signal to an input side of at least the integrator at a first stage; and an adder, arranged at an input stage side of the integrator at the last stage, configured to add an output of the integrator at a preceding stage of the integrator at the last stage to at least one path signal supplied from at least another path via a first resistor having at least a first coefficient. The above-mentioned integrator at the last stage includes an operational amplifier, an integration capacitor, and a second resistor having a second coefficient. The above-mentioned integration capacitor and the second resistor are connected in series between one input terminal and an output terminal of the operational amplifier. A coefficient of each degree of an open loop transfer function is determined in accordance with the first coefficient of the first resistor and the second coefficient of the second resistor.

In carrying out the present disclosure and according to a second form thereof, there is provided a signal processing system. This signal processing system has a ΔΣ modulator that has an AD converting function for converting analog signal supplied from an analog signal processing system into a digital signal. This ΔΣ modulator has a plurality of integrators cascaded to an input of an analog signal; a quantizer configured to quantize an output signal of the integrator at a last stage and output a resultant digital signal; a DA converter for feedback configured to convert the digital signal obtained by the quantizer into an analog signal and supply the analog signal to an input side of at least the integrator at a first stage; and an adder, arranged at an input stage side of the integrator at the last stage, configured to add an output of the integrator at a preceding stage of the integrator at the last stage to at least one path signal supplied from at least another path via a first resistor having at least a first coefficient. The above-mentioned integrator at the last stage includes an operational amplifier, an integration capacitor, and a second resistor having a second coefficient. The above-mentioned integration capacitor and the second resistor are connected in series between one input terminal and an output terminal of the operational amplifier. A coefficient of each degree of an open loop transfer function is determined in accordance with the first coefficient of the first resistor and the second coefficient of the second resistor.

As described above and according to forms of the present disclosure, a ΔΣ modulator can be realized without involving increased power dissipation and circuit scale.

DETAILED DESCRIPTION OF THE PREFERRED EMBODIMENTS

The present disclosure will be described in further detail by way of embodiments thereof with reference to the accompanying drawings. It should be noted that the explanation is made in the following order:

(1) First embodiment;
(2) Second embodiment;
(3) Third embodiment; and
(4) Fourth embodiment.

1. First Embodiment

First outline configuration of ΔΣ modulator

Figure 8:
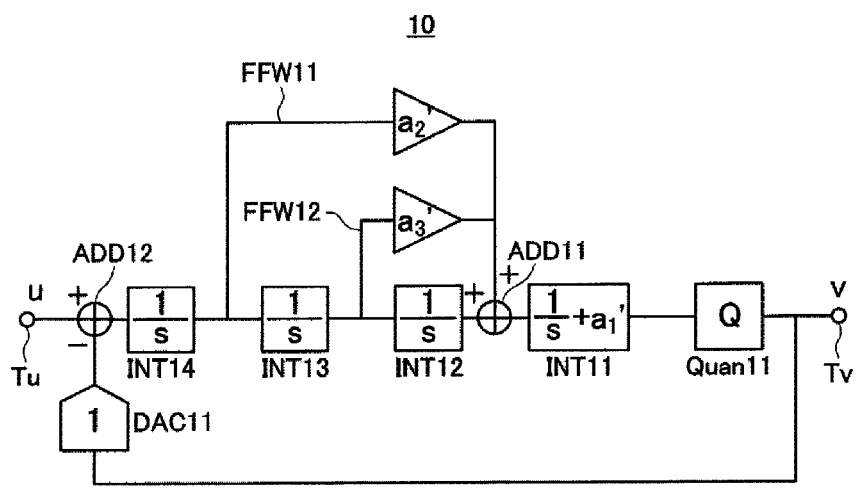
FIG. 8 is a circuit diagram illustrating an exemplary configuration of a LE modulator practiced as a first embodiment of the present disclosure.

Now, referring to FIG. 8, there is shown an outline configuration of a ΔΣ modulator practiced as a first embodiment of the present disclosure.

The ΔΣ modulator 10 practiced as the first embodiment has a first integrator INT11, a second integrator INT12, a third integrator INT13, a fourth integrator INT 14, and a quantizer Quan11 as shown in FIG. 8.

The ΔΣ modulator 10 has a first adder ADD11, a second adder ADD12, and a digital-to-analog (DA) converter DAC11 that is arranged in a feedback loop.

With the ΔΣ modulator 10 practiced as the first embodiment, a feedforward path FFW11 is formed such that the output of the fourth integrator INT14 is multiplied by a coefficient $a_2'$ and then a result of this multiplication is entered in the first adder ADD11 as a path signal.

Likewise, with the ΔΣ modulator 10 practiced as the first embodiment, a feedforward path FFW12 is formed such that the output of the third integrator INT13 is multiplied by a coefficient $a_3'$ and then a result of this multiplication is entered in the first adder ADD11 as a path signal.

The ΔΣ modulator according to the first embodiment 10 has no DA converter for feeding back the output of the quantizer Quan11 to the first adder ADD11.

In FIG. 8, u is representative of an analog input signal, Tu is representative of an analog signal input terminal, v is representative of a digital output signal, and Tv is representative of a digital signal output terminal. $a_1'$ is representative of a coefficient that is equivalent to a second coefficient and applied to the processing of the first integrator INT11 and Q is representative of an effective gain of the quantizer Quan11.

A gain of the DA converter DAC11 is set to 1.

In the ΔΣ modulator 10, the first input terminal of the second adder ADD12 is connected to the analog signal input terminal Tu and the second input terminal is connected to the output of the DA converter DAC11.

The output of the second adder ADD12 is connected to the input of the fourth integrator INT14.

The output of the fourth integrator INT14 is connected to the input of the third integrator INT13 and to the first input terminal of the first adder ADD11 via the feedforward path 11 FFW11 of the coefficient $a_2'$.

The output of the third integrator INT13 is connected to the input of the second integrator INT12 and to the first input terminal of the first adder ADD11 via the feedforward path FFW12 of the coefficient a3'.

The output of the second integrator INT12 is connected to the second input terminal of the first adder ADD11, the output of the first adder ADD11 is connected to the input of the first integrator INT11, and the output of the first integrator INT11 is connected to the input of the quantizer Quan11.

The output of the quantizer Quan11 is connected to the digital signal output terminal Tv and this digital signal is fed back to the DA converter DAC11.

The coefficients $a_2'$ and coefficient $a_3'$ are equivalent to the first coefficient.

Figure 7:
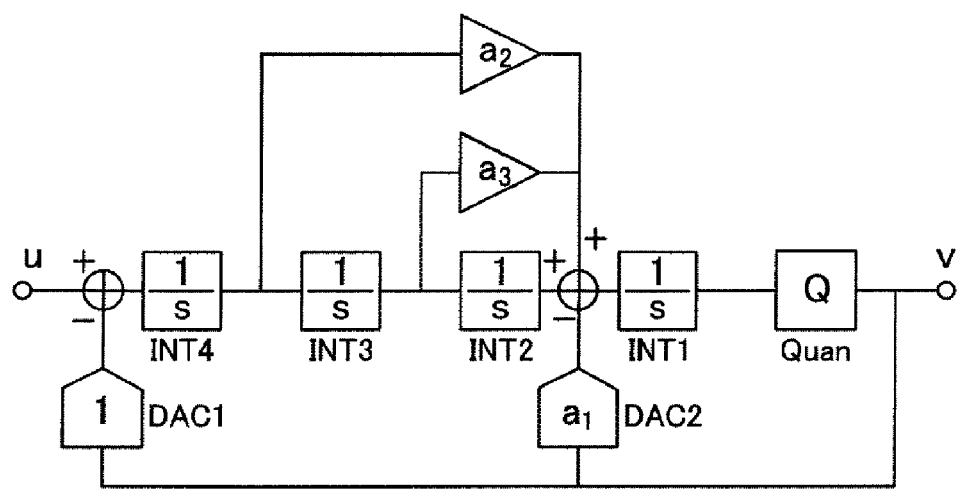
FIG. 7 is a circuit diagram illustrating a ΔΣ modulator using both feedback and feedforward.

Table 1 lists the coefficients of the degrees of open-loop transfer functions of the ΔΣ modulator 10 shown in FIG. 8 practiced as the first embodiment and the ΔΣ modulator 1D shown in FIG. 7 as a comparison example.

TABLE 1

|  | Modulator of FIG. 7 | Modulator of FIG. 8 |
| --- | --- | --- |
| Primary coefficient | $a_1Q$ | $a_1'a_2'Q$ |
| Secondary coefficient | $a_2Q$ | $(a_1'a_3' + a_2')Q$ |
| Tertiary coefficient | $a_3Q$ | $(a_1' + a_3')Q$ |
| Quaternary coefficient | Q | Q |

Coefficients of Degrees of Open-loop transfer functions of Modulators of FIG. 7 and FIG. 8

The ΔΣ modulator 10 practiced as the first embodiment uses the coefficient $a_1'$ independent of frequency as the transfer characteristic of the first integrator INT11 as compared with the ΔΣ modulator 1D shown in FIG. 7.

In addition, feedforward coefficients expressed by $a_2$ and $a_3$ in FIG. 7 are set to the first coefficients $a_2'$ and $a_3'$, respectively, and the DAC1 shown in FIG. 7 is removed as unnecessary.

As described above, table 1 shows the coefficients of the degrees of the open-loop transfer functions of the ΔΣ modulator shown in FIG. 7 and the ΔΣ modulator practiced as the first embodiment shown in FIG. 8.

If the coefficients of the degrees of the ΔΣ modulator 1D shown in FIG. 7 and the ΔΣ modulator 10 shown in FIG. 8 are equal to each other, then it can be said that the ΔΣ modulator 1D and the ΔΣ modulator 10 are equivalent to each other.

Figure 1A:
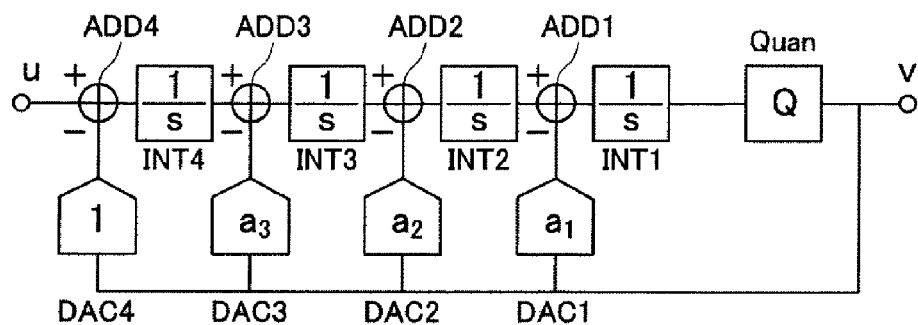
FIGS. 1A and 1B are conceptual diagrams illustrating general continuous-time system quadrature lowpass type ΔΣ modulators.
Figure 1B:
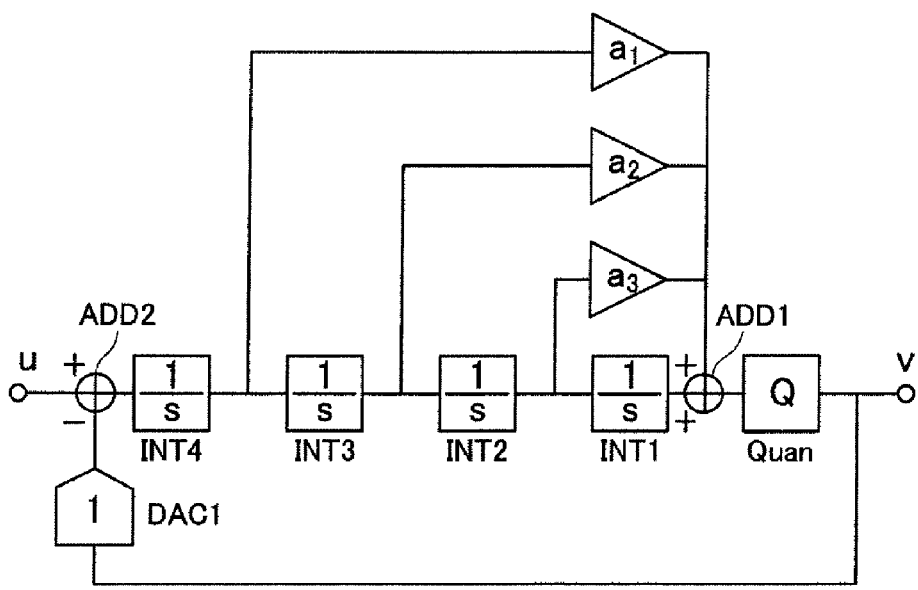
Figure 2:
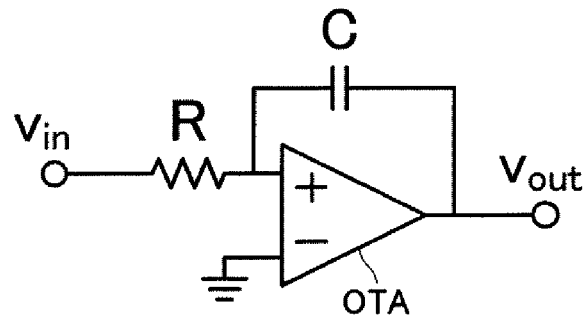
FIG. 2 is a circuit diagram illustrating an exemplary configuration of an integrator which is an element block of a ΔΣ modulator.
Figure 3:
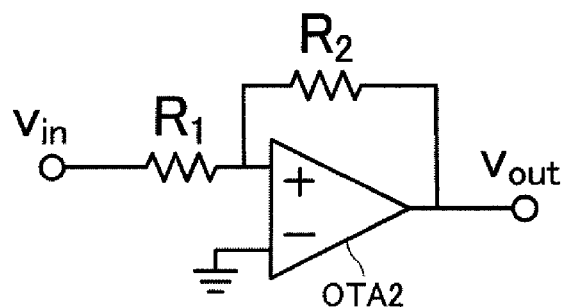
FIG. 3 is a circuit diagram illustrating an exemplary configuration of an adder which is an element block of a ΔΣ modulator.
Figure 4:
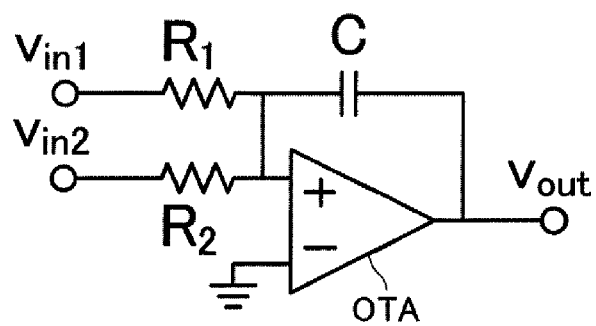
FIG. 4 is a circuit diagram illustrating a circuit made up of a 2-input, 1-output adder and integrator.
Figure 5:
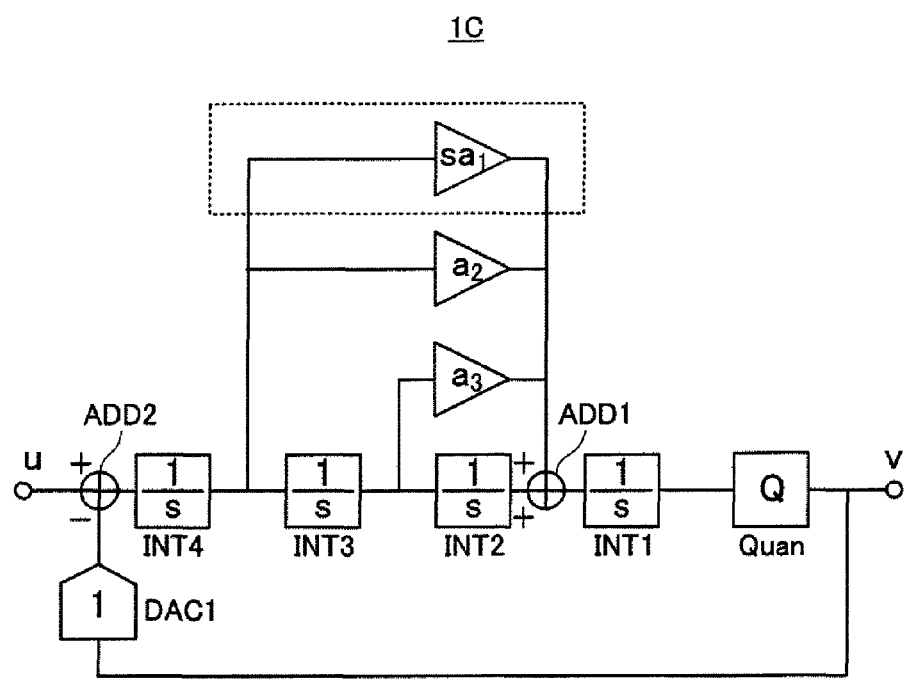
FIG. 5 is a circuit diagram illustrating an exemplary configuration of a ΔΣ modulator which does not use an adder immediately before a quantizer as a variation to the configuration shown in FIG. 1B.
Figure 6:
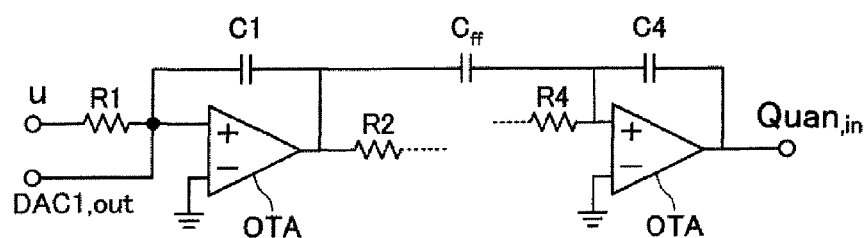
FIG. 6 is a circuit diagram illustrating a circuit for realizing a portion enclosed by dotted lines shown in FIG. 5.

Therefore, in order to obtain a coefficient of each path in FIG. 8, a solution of simultaneous equations expressed by equations (5) below may be used on the basis of the coefficients shown in FIG. 7 (or FIG. 5 or FIG. 1B).

$$\begin{cases} a_1 = a_1'a_2' \\ a_2 = a_1'a_3' + a_2' \\ a_3 = a_1' + a_3' \end{cases} \quad (5)$$

When the simultaneous equations are solved, each of the coefficients ($a_1'$, $a_2'$, and $a_3'$) provides a solution of a cubic equation.

The solutions of a cubic equation are two conjugate complex solutions and one real solution. Use of the real solution can realize the modulator only by resistors. Each resistor can be realized with a relatively small occupied area and does not consume the power, so that, as compared with the modulator shown in FIG. 7, the reduced power dissipation and occupied area can be achieved.

Figure 9:
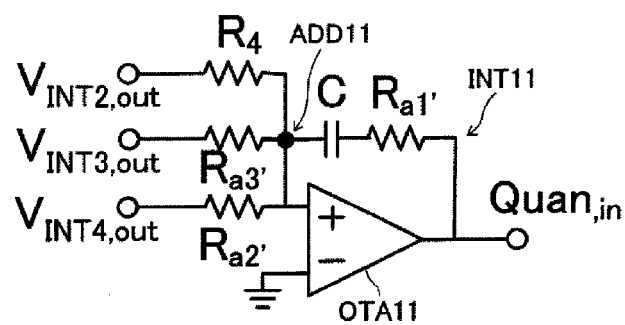
FIG. 9 is a circuit diagram illustrating an exemplary configuration of a first integrator shown in FIG. 8.

Referring to FIG. 9, there is shown a circuit diagram illustrating an exemplary configuration of the first integrator shown in FIG. 8.

The circuit shown in FIG. 9 is made up of an operational amplifier OTA11, resistors $Ra_1'$, $Ra_2'$, $Ra_3'$, R4, and a capacitor C.

The resistor $Ra_1'$ is equivalent to the second resistor and the resistors $Ra_2'$ and $Ra_3'$ are equivalent to the first resistor.

The positive input terminal of the operational amplifier OTA11 is connected to the supply line of output voltage Vint4 of the fourth integrator INT14 via the resistor $Ra_2'$ and to the supply line of output voltage Vint3 of the third integrator INT13 via the resistor $Ra_3'$.

Further, the positive input terminal of the operational amplifier OTA11 is connected to the supply line of output voltage Vint2 of the second integrator INT12 via the resistor R4.

The connections between the positive input terminal of the operational amplifier OTA11 and the resistors $Ra_2'$, $Ra_3'$, and R4 form the first adder ADD11.

Between the positive input terminal and output terminal of the operational amplifier OTA11, the resistor $Ra_1'$ and capacitor C are connected in series.

The negative input terminal of the operational amplifier OTA11 is grounded.

In FIG. 9, the resistors $Ra_2'$ and $Ra_3'$ can be obtained by only changing the values of the resistors originally normally arranged required by the circuit configuration and the first integrator INT11 can be formed by adding only the resistor $Ra_1'$.

If the coefficient $a_1'$ of equation (5) is not a positive number, a negative resistance is required, thereby failing to realize the circuit shown in FIG. 9. The coefficient $a_1'$ is always a positive number can be expressed as follows.

Equation (5) is solved for $a_1'$ as follows:

$$a_1'^3 - a_3 a^{1/2} + a_2 a_1' - a_1 = 0 \quad (6)$$

On the other hand, because a cubic equation has two conjugate complex solutions and one real solution, let these solutions be $\alpha \pm \beta i$ and $\gamma$, then equation (6) can be expressed as equation (7) below.

$$(a_1' - \alpha + \beta i)(a_1' - \alpha - \beta i)(a_1' - \gamma) = 0 \quad (7)$$

Constant term (x) can be obtained as follows by developing equation (7):

$$x = -\gamma(-\alpha + \beta i)(-\alpha - \beta i) = -\gamma(\alpha^2 + \beta^2) \quad (8)$$

Comparison between the constant terms of equation (8) and equation (6) results as follows:

$$a_1 = \gamma(\alpha^2 + \beta^2) \quad (9)$$

$a_1$ is the primary coefficient and a positive number of the $\Delta\Sigma$ modulator on the basis of which $a_1$ was obtained. It is obvious that $\alpha$ squared and $\beta$ squared are positive numbers. Consequently, $\gamma$ always becomes a positive number, making it practicable to realize the circuit shown in FIG. 9 with resistors.

2. Second Embodiment

Second Outline Configuration of $\Delta\Sigma$ Modulator

Figure 10:
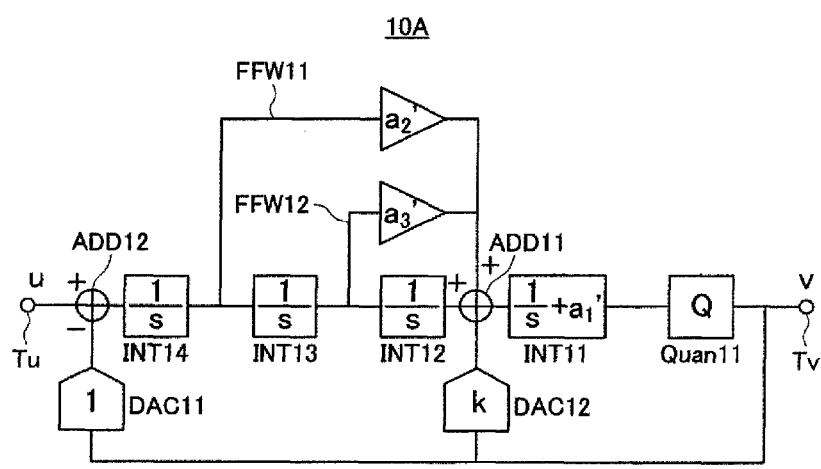
FIG. 10 is a circuit diagram illustrating an outline configuration of a continuous-time system quadrature ΔΣ modulator having a feedback path for delay compensation practiced as a second embodiment of the present disclosure.

Referring to FIG. 10, there is shown an outline configuration of a continuous-time system quadrature $\Delta\Sigma$ modulator having a feedback path for delay compensation practiced as a second embodiment of the present disclosure.

Figure 11:
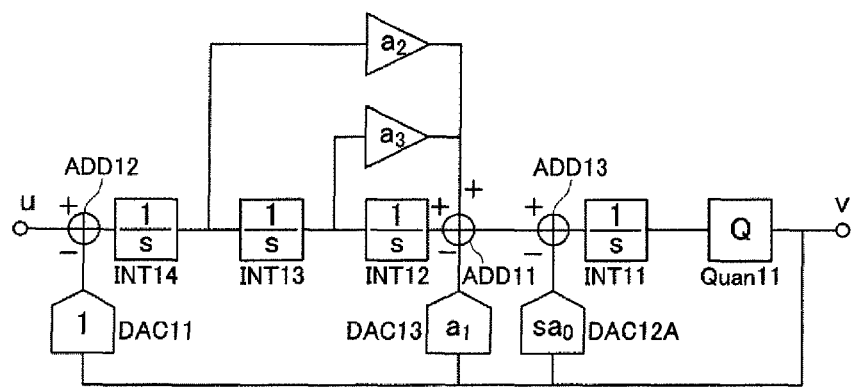
FIG. 11 is a circuit diagram illustrating a continuous-time system quadrature ΔΣ modulator having a feedback path for delay compensation as a comparison example.

FIG. 11 shows a continuous-time system quadrature $\Delta\Sigma$ modulator having a feedback path for delay compensation that is a comparison example.

The $\Delta\Sigma$ modulator 10A practiced as the second embodiment differs from the $\Delta\Sigma$ modulator 10 practiced as the first embodiment in the following points.

The $\Delta\Sigma$ modulator 10A has a second DA converter DAC12, the output of a quantizer Quan11 is fed back to a DA converter DAC12, and output of a DA converter DAC12 is connected to the input of a first integrator INT11.

A gain of the DA converter DAC12 is set to k.

Specific Configuration of the $\Delta\Sigma$ Modulator Shown in FIG. 10

Figure 12:
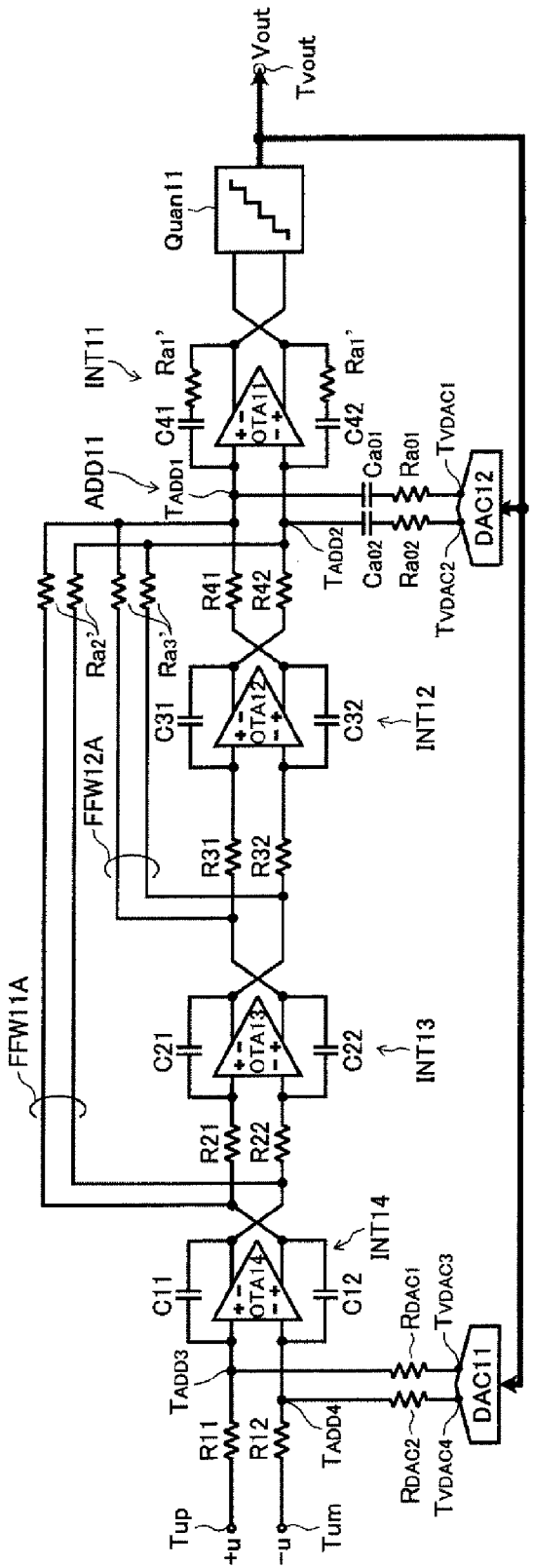
FIG. 12 is a circuit diagram illustrating specific exemplary configuration of the continuous-time system quadrature ΔΣ modulator having a feedback path for delay compensation practiced as the second embodiment of the present disclosure.

Referring to FIG. 12, there is shown a specific exemplary configuration of the continuous-time system quadrature $\Delta\Sigma$ modulator having a feedback path for delay compensation practiced as the second embodiment.

The $\Delta\Sigma$ modulator 10A shown in FIG. 12 is formed as a continuous-time system quadrature $\Delta\Sigma$ modulator.

The $\Delta\Sigma$ modulator 10A shown in FIG. 12 is configured as a circuit for receiving a differential input signal. In FIG. 12, +u is representative of a positive analog input signal, −u is representative of a negative analog signal, and $V_{out}$ is representative of a digital output signal.

As shown in FIG. 12, the $\Delta\Sigma$ modulator 10A has a first analog signal input terminal $T_{up}$, a second analog signal input terminal $T_{um}$, input resistors R11 and R12, and a digital signal output terminal $T_{vout}$.

The $\Delta\Sigma$ modulator 10A has a resistor $R_{a01}$ and a capacitor $C_{a01}$ connected in series to a first output terminal $T_{VDAC1}$ of a second DA converter DAC12 and a resistor $R_{a02}$ and a capacitor $C_{a02}$ connected in series to a second output terminal $T_{VDAC2}$.

The resistors $R_{a01}$ and $R_{a02}$ are equivalent to a third resistor.

The $\Delta\Sigma$ modulator 10A has a resistor $R_{DAC1}$ connected to the first output terminal $T_{VDAC3}$ of the first DA converter DAC11 and a resistor $R_{DAC2}$ connected to a second output terminal $T_{VDAC4}$.

At the output of a second integrator INT12, the $\Delta\Sigma$ modulator 10A has a first adder ADD11 and resistors R41 and R42 connected to the capacitors $C_{a01}$ and $C_{a02}$ respectively on the side of the second DA converter DAC12.

At the output of a third integrator INT13, the $\Delta\Sigma$ modulator 10A has resistors R31 and R32 connected to the input of the second integrator INT12 and a feedforward path FFW12A is connected to these resistors. A resistor $Ra_3'$ is connected to the feedforward path FFW12A.

At the output of a fourth integrator INT14, the $\Delta\Sigma$ modulator 10A has resistors R21 and R22 connected to the input of the fourth integrator INT14 and a feedforward path FFW11A is connected to these resistors. A resistor $Ra_2'$ is connected to the feedforward path FFW11A.

With the first adder ADD11, a first terminal $T_{ADD1}$ is formed by connections of a resistor 41, the resistor $Ra_2'$, the resistor $Ra_3'$, and the capacitor $C_{a01}$ and the second terminal $T_{ADD2}$ is formed by the connections of the resistor R42, the resistor $Ra_2'$, the resistor $Ra_3'$, and the capacitor $C_{a02}$.

With the second adder ADD12, a third terminal $T_{ADD3}$ is formed by the connection of the resistor R11 and the resistor $R_{DAC1}$ and a fourth terminal $T_{ADD4}$ is formed by the connection of the resistor R12 and the resistor $R_{DAC2}$.

The first integrator INT11 has a differential input/output operational amplifier OTA11, capacitors C41 and C42, and resistors $Ra_1'$ and $Ra_1'$.

With the operational amplifier OTA11, the positive input terminal (the non-inverted input terminal +) is connected to the first terminal $T_{ADD1}$ of the first adder ADD11 and the negative input terminal (inverted input terminal −) is connected to the second terminal $T_{ADD2}$ of the first adder ADD11A.

With the operational amplifier OTA11, the positive output terminal is connected to the positive input terminal of a quantizer Quan11 and the negative output terminal is connected to the negative input terminal of the quantizer Quan11.

The capacity C41 and the resistor Ra1' are connected in series between the negative output terminal and the positive input terminal of the operational amplifier OTA11.

The capacity C42 and the resistor Ra1' are connected in series between the positive output terminal and the negative output terminal of the operational amplifier OTA11.

The second integrator INT12 has a differential input/output operational amplifier OTA12 and capacitors C31 and C32.

With the operational amplifier OTA12, the positive/negative input terminal (non-inverted input terminal +) is connected to the resistor R31 and the negative input terminal (inverted input terminal −) is connected to the resistor R32.

With the operational amplifier OTA12, the positive output terminal is connected to the resistor R41, the negative output, terminal is connected to the resistor R42.

The capacitor C31 is connected between the negative output terminal and the positive input terminal of the operational amplifier OTA12.

The capacitor C32 is connected between the positive output terminal and the negative output terminal of the operational amplifier OTA12.

The third integrator INT13 has a differential input/output operational amplifier OTA13 and capacitors C21 and C22.

With the operational amplifier OTA13, the positive/negative input terminal (non-inverted input terminal +) is connected to the resistor R21 and the negative input terminal (inverted input terminal −) is connected to the resistor R22.

With the operational amplifier OTA13, the positive output terminal is connected to the resistor R31, the negative output terminal is connected to the resistor R32.

The capacitor C21 is connected between the negative output terminal and the positive input terminal of the operational amplifier OTA13.

The capacitor C22 is connected between the positive output terminal and the negative output terminal of the operational amplifier OTA13.

The fourth integrator INT14 has a differential input/output operational amplifier OTA14 and capacitors C11 and C12.

With the operational amplifier OTA14, the positive/negative input terminal (non-inverted input terminal +) is connected to the third terminal $T_{ADD3}$ and the negative input terminal (inverted input terminal −) is connected to the fourth terminal $T_{ADD4}$.

With the operational amplifier OTA14, the positive output terminal is connected to the resistor R21, the negative output terminal is connected to the resistor R22.

The capacitor C11 is connected between the negative output terminal and the positive input terminal of the operational amplifier OTA14.

The capacitor C12 is connected between the positive output terminal and the negative output terminal of the operational amplifier OTA14.

The ΔΣ modulator 10A shown in FIG. 12 having the above-mentioned configuration is formed as a continuous-time system quadrature 1-bit feedforward ΔΣ modulator as described above, in which the second DA converter DAC12 plays the roles of the last-stage feedback DA converter and the loop delay compensation.

Meanwhile, with a continuous-time system ΔΣ modulator, a signal delay from the quantizer output to the DA converter output deteriorates stability.

In order to compensate this deterioration, a technology was proposed in which a 0-degree (independent of frequency characteristics) feedback path is provided.

The DA converter DAC12A shown in FIG. 11 provides a circuit added to provide delay compensation. In order to omit the adder immediately before (in the input stage) of the quantizer Quan11, the gain of the DA converter DAC12A is set to s$a_0$ to provide a differential characteristic.

The output of the DA converter DAC12A is integrated through the first integrator INT11, so that a frequency-independent feedback signal is obtained at the input of the quantizer Quan11.

FIG. 10 and FIG. 12 are a conceptual diagram and a specific circuit diagram, respectively, in which this technology is applied to the ΔΣ modulator shown in FIG. 11.

The derivation of the coefficients $a_1'$, $a_2'$, and $a_3'$ of the degrees in FIG. 10 and FIG. 12 are the same as that shown in FIG. 8. Gain k of the DA converter DAC12 for delay compensation must be set as follows along with the change of transfer function of the first integrator INT11.

$$k = \frac{a_0}{\frac{1}{s} + a_1'} \quad (10)$$

This can be easily executed by simply adding a resistor in series with a capacitor as with the change associated with the first integrator INT11. Besides, this configuration can provide an effect of reducing a high-frequency component signal obtained by voltage current conversion through a capacitor that is a problem with the converter shown in FIG. 5, thereby mitigating the requirement specifications of the first integrator INT11.

3. Third Embodiment

Third Outline Configuration of ΔΣ Modulator

Figure 13:
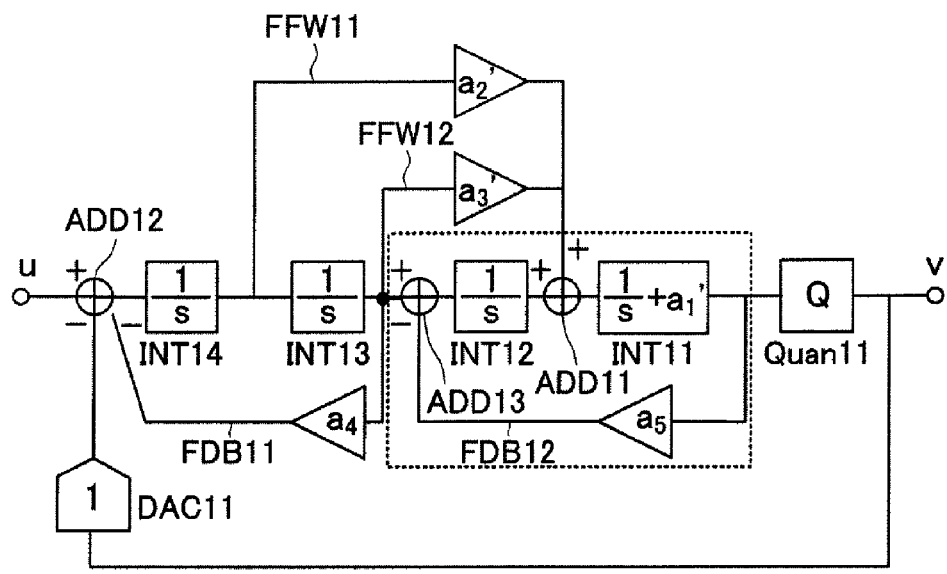
FIG. 13 is a circuit diagram illustrating an outline configuration of the continuous-time system quadrature ΔΣ modulator with transmission zeros in NTF practiced as the second embodiment of the present disclosure.

Referring to FIG. 13, there is shown an outline configuration of a continuous-time system quadrature ΔΣ modulator with transmission zeros in NTF practiced as a third embodiment of the present disclosure.

Figure 14:
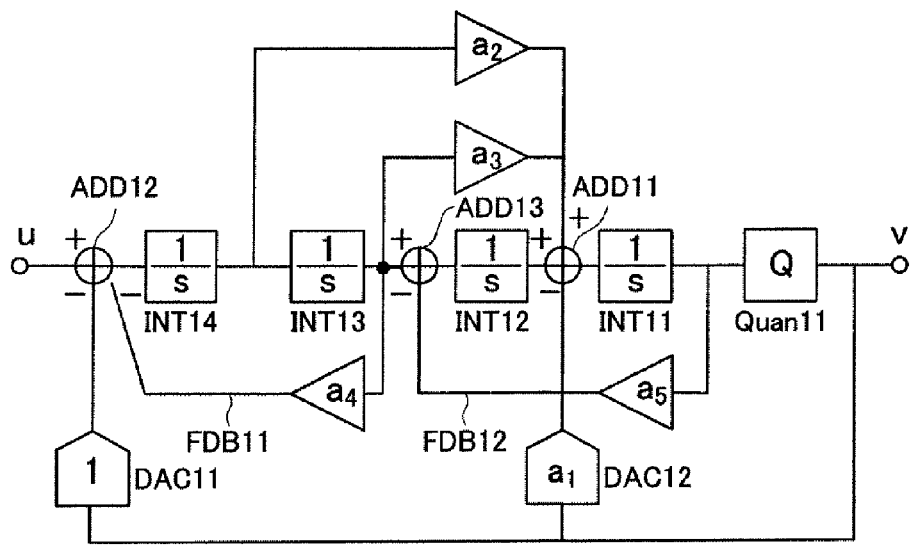
FIG. 14 is a circuit diagram illustrating a continuous-time system quadrature ΔΣ modulator with transmission zeros in NTF as a comparison example.

Referring to FIG. 14, there is shown a continuous-time system quadrature ΔΣ modulator with transmission zeros in NTF as a comparison example.

The ΔΣ modulator 10B practiced as the third embodiment differs from the ΔΣ modulator 10A practiced as the second embodiment in the following points.

The ΔΣ modulator 10B does not have a second DA converter that is a delay compensation path and has a third adder ADD13 between a third integrator INT13 and a second integrator INT12.

In addition, the ΔΣ modulator 10B has a feedback path FDB11 for feeding back the output of the third integrator INT13 to the input of a fourth integrator INT11 by gain a4.

Moreover, the ΔΣ modulator 10B has a feedback path FDB12 for feeding back the output of the first integrator INT11 to the input (a third adder ADD13) of the second integrator INT12 by gain a5.

Specific Exemplary Configuration of the ΔΣ Modulator Shown in FIG. 13

Figure 15:
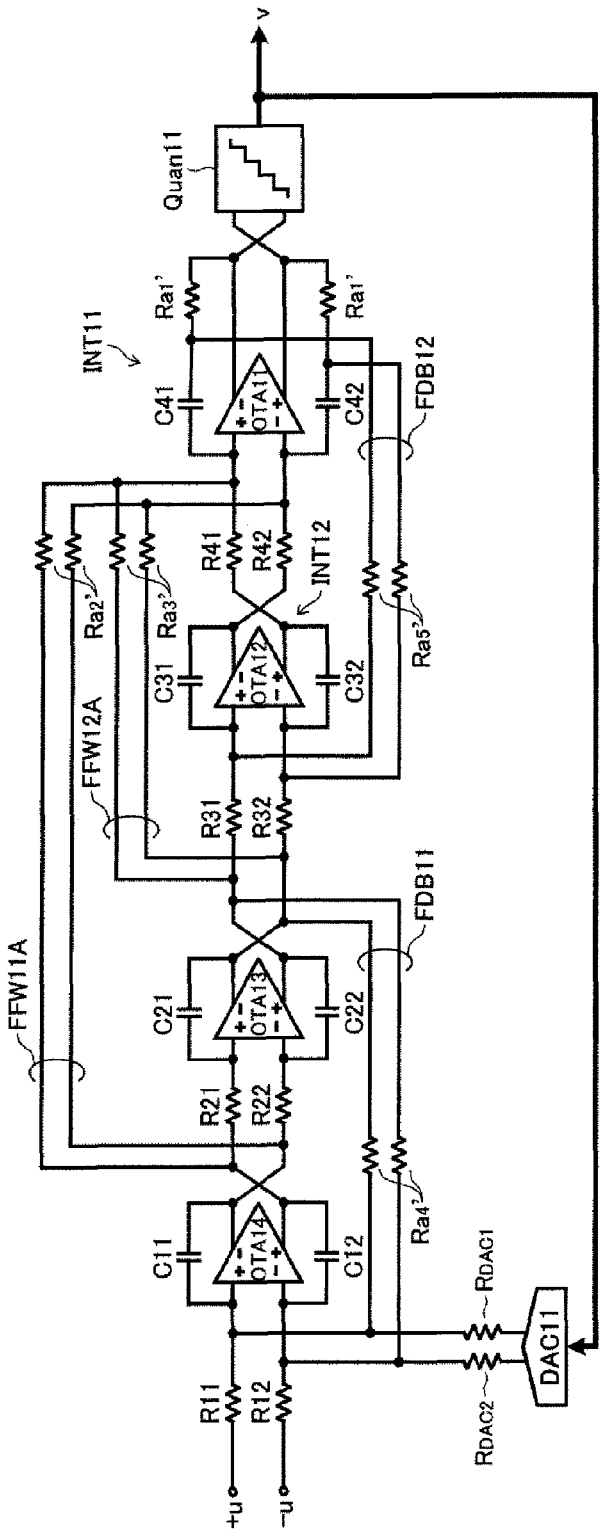
FIG. 15 is a circuit diagram illustrating a specific exemplary configuration of a continuous-time system quadrature ΔΣ modulator with transmission zeros in NTF practiced as a third embodiment of the present disclosure.

Referring to FIG. 15, there is shown a specific exemplary configuration of the continuous-time system quadrature ΔΣ modulator with transmission zeros in NTF practiced as the third embodiment.

The ΔΣ modulator 10B shown in FIG. 15 has nothing of the second DA converter DAC12, the resistor $R_{a01}$, the capacitor $C_{a01}$, and the resistor $R_{a02}$ and the capacitor $C_{a02}$ of the circuit shown in FIG. 12.

Instead, feedback paths FDB11 and FDB12 are added to the circuit configuration shown in FIG. 12.

A resistor $Ra_4$ is connected to the feedback path FDB11 and a resistor $Ra_5$ is connected to the feedback path FDB12.

Referring to FIG. 14, there is shown a continuous-time system ΔΣ modulator with transmission zeros added to NTF.

With the ΔΣ modulator shown in FIG. 14, feedback is applied from the output of a first integrator INT11 to the input of a second integrator INT12 and from the output of a third integrator INT13 to the input of a fourth integrator INT14 to provide two transmission zeros as a whole by providing a resonator.

Consequently, the noise shaping effect can be enhanced, thereby providing a general technique in the design of a ΔΣ modulator along with the above-described delay compensation.

FIG. 13 and FIG. 15 are a conceptual diagram and a circuit diagram, respectively, illustrating the ΔΣ modulator shown in FIG. 14.

The derivation of the coefficients $a_1'$, $a_2'$, and $a_3'$ of the degrees shown in FIG. 13 is the same as that shown in FIG. 8.

In applying this technique with transmission zeros held by NTF, the feedback from the output of the first integrator INT11 to the input of the second integrator INT12 results as follows.

The influence of the resistor $Ra_1$ added to the first integrator INT11 lowers the quality factor of the resonator (enclosed by dotted lines in FIG. 13), thereby lowering the effect of noise shaping.

In order to prevent the quality factor of the resonator from being lowered, a circuit may be configured such that feedback is applied from the connection parts (or connection points) between the capacitor C41 and the resistor $Ra_1'$ and the connection between the capacitor C42 and the resistor $Ra_1'$ of the first integrator INT11 to the input block of the second integrator INT12 as shown in FIG. 15.

According to the third embodiment described above, the DA converter for giving the primary coefficient of an open loop gain in a continuous-time system ΔΣ modulator to be applied to a receiver in wireless communication, audio equipment, and medical instrumentation can be omitted by resistor adding and value changing.

Use of this technique can configure a ΔΣ modulator without involving increased power dissipation and circuit scale at all.

4. Fourth Embodiment

Figure 16:
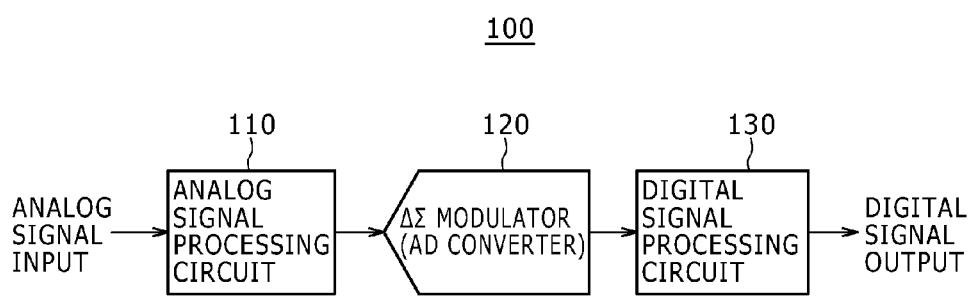
FIG. 16 is a block diagram illustrating an exemplary configuration of a signal processing system practiced as a fourth embodiment of the present disclosure.

Referring to FIG. 16, there is shown a block diagram illustrating an exemplary configuration of a signal processing system practiced as a fourth embodiment of the present disclosure.

This signal processing system 100 is formed as a signal processing system to which any one of the ΔΣ modulators 10 through 10B functioning as any one of the AD converters associated with the first through third embodiments is applicable. The signal processing system 100 is a signal processing system of a reception apparatus of communication equipment for example.

The signal processing system 100 has an analog signal processing circuit 110, an AD converter 120, and a digital signal processing circuit 130.

In the signal processing system 100, any one of the ΔΣ modulators 10 through 10B that function as AD converters practiced as the first though third embodiments is applicable as the AD converter 120.

In the signal processing system 100 shown in FIG. 16, signal processing is executed by the digital signal processing circuit 130 as long as possible to reduce the scale of the analog signal processing circuit 110, thereby leading the expectation of reduced circuit size and enhanced circuit efficiency.

Here, in order to realize the system described above, that is to say, in order to execute the signal processing executed by the analog signal processing circuit 110 by the digital signal processing circuit 130, it is necessary to execute AD conversion without damaging the information of the original signal as long as possible. For achieving this purpose, use of an AD converter having a high S/N ratio is required.

It should be noted that, in the above-mentioned embodiments, the description was made by use of a single operation for an example as outline configurations; however, the technology described so far is applicable to any of a single operation and a differential operation.

The technology described so far can also take the following configurations described below.

(1) A ΔΣ modulator including:
a plurality of integrators cascaded to an input of an analog signal;
a quantizer configured to quantize an output signal of the integrator at a last stage and output a resultant digital signal;
a DA converter for feedback configured to convert the digital signal obtained by the quantizer into an analog signal and supply the analog signal to an input side of at least the integrator at a first stage; and
an adder, arranged at an input stage side of the integrator at the last stage, configured to add an output of the integrator at a preceding stage of the integrator at the last stage to at least one path signal supplied from at least another path via a first resistor having at least a first coefficient,
wherein the integrator at the last stage includes
an operational amplifier,
an integration capacitor, and
a second resistor having a second coefficient,
the integration capacitor and the second resistor being connected in series between one input terminal and an output terminal of the operational amplifier,
a coefficient of each degree of an open loop transfer function being determined in accordance with the first coefficient of the first resistor and the second coefficient of the second resistor.

(2) The ΔΣ modulator described in (1) above, further including: integrators of at least two stages cascaded via the resistors to the input side of the integrator at the last stage; and
a feedforward path for forward feeding an output of at least the integrator at the first stage to the adder at the input side of the integrator at the last stage via the first resistor.

(3) The ΔΣ modulator described in (1) or (2) above, further including: a second DA converter for feedback configured to convert a digital signal obtained by the quantizer into an analog signal and supply the analog signal to the adder at the input side of the integrator at the last stage.

(4) The ΔΣ modulator described in (3) above, further including:
a capacitor configured to couple an output of the second DA converter with the integrator at the last stage; and
a third resistor connected to the capacitor in series.

(5) The ΔΣ modulator described in (1) or (2) above, wherein the integrator at the last stage forms a resonator, and
a connection part of the integration capacitor and the second resistor connected with each other in series is fed back to the input side of the integrator two stages before the quantizer.

(6) A signal processing system having a ΔΣ modulator having an AD converting function for converting analog signal supplied from an analog signal processing system into a digital signal, the ΔΣ modulator including:
a plurality of integrators cascaded to an input of an analog signal;
a quantizer configured to quantize an output signal of the integrator at a last stage and output a resultant digital signal;
a DA converter for feedback configured to convert the digital signal obtained by the quantizer into an analog signal and supply the analog signal to an input side of at least the integrator at a first stage; and
an adder, arranged at an input stage side of the integrator at the last stage, configured to add an output of the integrator at a preceding stage of the integrator at the last stage to at least one path signal supplied from at least another path via a first resistor having at least a first coefficient,
wherein the integrator at the last stage includes
an operational amplifier, an integration capacitor, and a second resistor having a second coefficient, the integration capacitor and the second resistor being connected in series between one input terminal and an output terminal of the operational amplifier, a coefficient of each degree of an open loop transfer function being determined in accordance with the first coefficient of the first resistor and the second coefficient of the second resistor.

The present disclosure contains subject matter related to that disclosed in Japanese Priority Patent Application JP 2011-017648 filed in the Japan Patent Office on Jan. 31, 2011, the entire content of which is hereby incorporated by reference.

While preferred embodiments of the present disclosure have been described using specific terms, such description is for illustrative purpose only, and it is to be understood that changes and variations may be made without departing from the spirit or scope of the following claims.

What is claimed is:

1. A delta-sigma modulator comprising:

a plurality of integrators cascaded to an input of an analog signal;

a quantizer configured to quantize an output signal of the integrator at a last stage and output a resultant digital signal;

a first digital-to-analog converter for feedback configured to convert the digital signal obtained by the quantizer into an analog signal and supply the analog signal to an input side of at least the integrator at a first stage;

an adder, arranged at an input stage side of the integrator at the last stage, configured to add an output of the integrator at a preceding stage of the integrator at the last stage to at least one path signal supplied from at least another path via a first resistor having at least a first coefficient, wherein the integrator at the last stage comprises an operational amplifier, an integration capacitor, and a second resistor having a second coefficient, the integration capacitor and the second resistor being connected in series between one input terminal and an output terminal of the operational amplifier, a coefficient of each degree of an open loop transfer function being determined in accordance with the first coefficient of the first resistor and the second coefficient of the second resistor, wherein integrators of at least two stages are cascaded via the resistors to the input side of the integrator at the last stage;

a feedforward path for forward feeding an output of at least the integrator at the first stage to the adder at the input side of the integrator at the last stage via the first resistor;

a second digital-to-analog converter for feedback configured to convert a digital signal obtained by the quantizer into an analog signal and supply the analog signal to the adder at the input side of the integrator at the last stage;

a capacitor configured to couple an output of the second digital-to-analog converter with the integrator at the last stage; and a third resistor connected to the capacitor in series.

2. The delta-sigma modulator according to claim 1, wherein the integrator at the last stage forms a resonator, and a connection part of the integration capacitor and the second resistor connected with each other in series is fed back to the input side of the integrator two stages before the quantizer.

3. The delta-sigma modulator according to claim 1, further comprising a third digital-to-analog converter configured to convert the digital signal obtained by the quantizer into an analog signal and supply the analog signal to the adder at the input side of the integrator at the last stage for providing delay compensation.

4. The delta-sigma modulator according to claim 3, wherein an output of the third digital-to-analog converter is integrated through the integrator at the last stage so that a frequency-independent feedback signal is obtained at the input of the quantizer.

5. A signal processing system having a delta-sigma modulator, the delta-sigma modulator comprising:

a plurality of integrators cascaded to an input of an analog signal;

a quantizer configured to quantize an output signal of the integrator at a last stage and output a resultant digital signal;

a digital-to-analog converter for feedback configured to convert the digital signal obtained by the quantizer into an analog signal and supply the analog signal to an input side of at least the integrator at a first stage; and an adder, arranged at an input stage side of the integrator at the last stage, configured to add an output of the integrator at a preceding stage of the integrator at the last stage to at least one path signal from another integrator via a first resistor having at least a first coefficient, wherein the integrator at the last stage comprises an operational amplifier, an integration capacitor, and a second resistor having a second coefficient, the integration capacitor and the second resistor being connected in series between one input terminal and an output terminal of the operational amplifier, the quantizer being configured to quantize the analog output signal of the integrator at the last stage and output the resultant digital signal.

6. The signal processing system of claim 5, wherein a coefficient of each degree of an open loop transfer function being determined in accordance with the first coefficient of the first resistor and the second coefficient of the second resistor.

7. The signal processing system according to claim 5, further comprising:

integrators of at least two stages cascaded via the resistors to the input side of the integrator at the last stage; and a feedforward path for forward feeding an output of at least the integrator at the first stage to the adder at the input side of the integrator at the last stage via the first resistor.

8. The signal processing system according to claim 7, further comprising:

a second digital-to-analog converter for feedback configured to convert a digital signal obtained by the quantizer into an analog signal and supply the analog signal to the adder at the input side of the integrator at the last stage.

9. The signal processing system according to claim 8, further comprising:

a capacitor configured to couple an output of the second digital-to-analog converter with the integrator at the last stage; and a third resistor connected to the capacitor in series.

10. The signal processing system according to claim 7, wherein the integrator at the last stage forms a resonator, and a connection part of the integration capacitor and the second resistor connected with each other in series is fed back to the input side of the integrator two stages before the quantizer.

11. A delta-sigma modulator comprising:

a plurality of integrators cascaded to an input of an analog signal;

a quantizer configured to quantize an output signal of the integrator at a last stage and output a resultant digital signal;

a first digital-to-analog converter for feedback configured to convert the digital signal obtained by the quantizer into an analog signal and supply the analog signal to an input side of at least the integrator at a first stage; and an adder, arranged at an input stage side of the integrator at the last stage, configured to add an output of the integrator at a preceding stage of the integrator at the last stage to at least one path signal supplied from at least another path via a first resistor having at least a first coefficient, wherein the integrator at the last stage comprises an operational amplifier, an integration capacitor, and a second resistor having a second coefficient, the integration capacitor and the second resistor being connected in series between one input terminal and an output terminal of the operational amplifier, a coefficient of each degree of an open loop transfer function being determined in accordance with the first coefficient of the first resistor and the second coefficient of the second resistor, wherein integrators of at least two stages cascaded via the resistors to the input side of the integrator at the last stage;

a feedforward path for forward feeding an output of at least the integrator at the first stage to the adder at the input side of the integrator at the last stage via the first resistor, wherein the integrator at the last stage forms a resonator, and a connection part of the integration capacitor and the second resistor connected with each other in series is fed back to the input side of the integrator two stages before the quantizer.

12. The delta-sigma modulator according to claim 11, wherein the second resistor with the integrator at the last stage lowers the quality factor of the resonator.

13. The delta-sigma modulator according to claim 11, further comprising:

a second digital-to-analog converter for feedback configured to convert a digital signal obtained by the quantizer into an analog signal and supply the analog signal to the adder at the input side of the integrator at the last stage.

14. The delta-sigma modulator according to claim 13, further comprising:

a capacitor configured to couple an output of the second digital-to-analog converter with the integrator at the last stage; and a third resistor connected to the capacitor in series.

* * * * *